United States Patent [19]

Ferrant

[11] Patent Number: 4,761,767

[45] Date of Patent: Aug. 2, 1988

[54] HIGH RELIABILITY INTEGRATED CIRCUIT MEMORY

[75] Inventor: Richard Ferrant, Aix en Provence, France

[73] Assignee: Eurotechnique, Rousset, France

[21] Appl. No.: 818,030

[22] Filed: Jan. 13, 1986

[30] Foreign Application Priority Data

Jan. 15, 1985 [FR] France ............... 85 00526

[51] Int. Cl.⁴ .............................................. G11C 7/00
[52] U.S. Cl. .................................................. 365/200
[58] Field of Search ........................ 365/200; 371/10

[56] References Cited

U.S. PATENT DOCUMENTS 4,358,833 11/1982 Folmsbee et al. ............... 365/200
4,532,611 7/1985 Countryman, Jr. ............... 365/200
4,639,895 1/1987 Iwahashi et al. .................. 365/200
4,707,810 11/1987 Ferrant ............................. 365/200

Primary Examiner—James W. Moffitt
Attorney, Agent, or Firm—Oblon, Fisher, Spivak, McClelland & Maier

[57] ABSTRACT

The invention provides integrated circuit memories with repair circuits. These repair circuits allow redundant memory cell lines to be substituted for defective cell lines. The invention takes advantage of the existence of these substitution circuits for electrically, and no longer only functionally, decoupling the defective lines. A connection connects circuits for biasing the cell lines to the repair circuit of this line. When the line is repaired (i.e. neutralized) it is automatically unbiased.

5 Claims, 3 Drawing Sheets

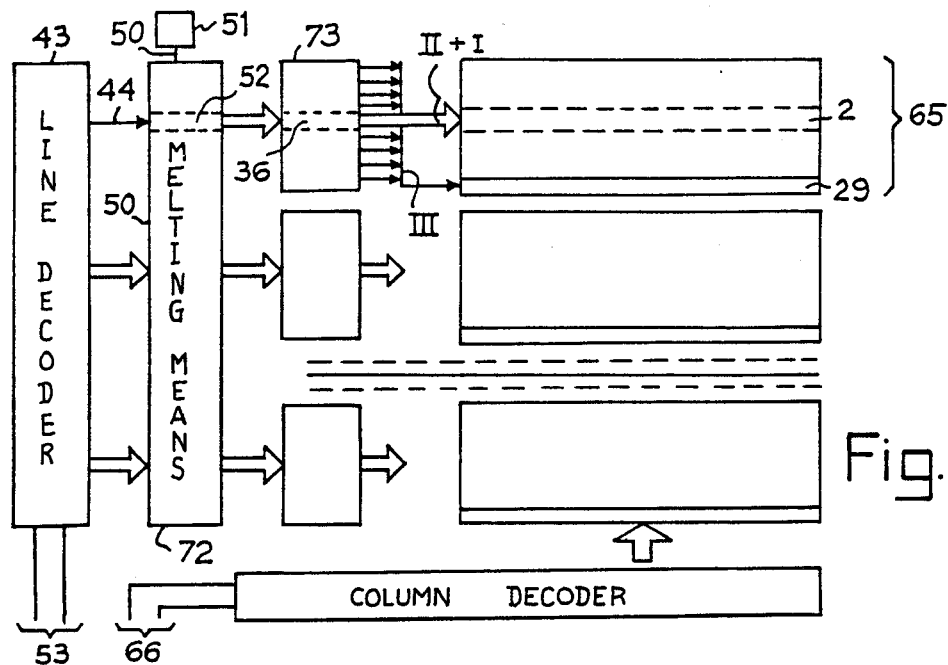
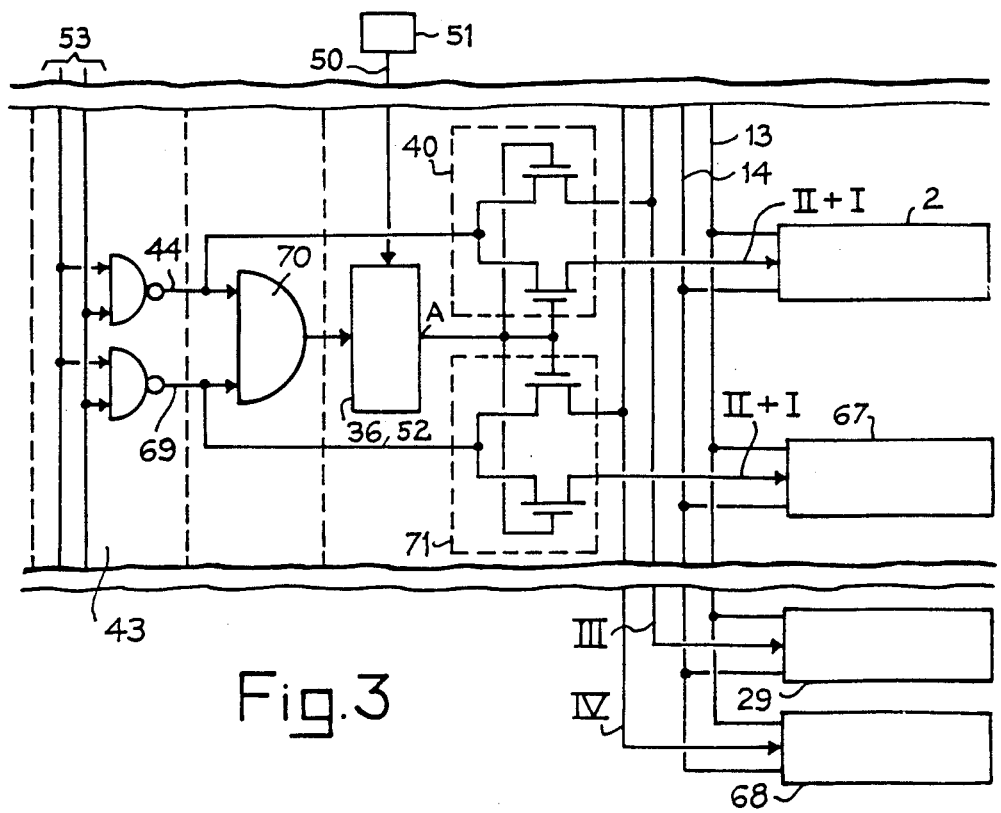

HIGH RELIABILITY INTEGRATED CIRCUIT MEMORY

BACKGROUND OF THE INVENTION

1. Field of the Invention

The invention relates to high reliability integrated circuit memories and more particularly to memories having repair circuits.

2. Description of the Prior Art

An integrated circuit memory is in the form of a semiconductor chip having microscopic electronic circuits arranged with respect to each other and which may contain by their electric states digitized information. The development of the technique for manufacturing memories tends towards increasing the density of the circuits contained in the memories, as well as increasing the size of the memories themselves. The reasons for this development are essentially related to the greater reliability of integrated circuits with respect to comparable organizations made with discrete elements. This desired technical development meets with a major difficulty: the possibility of effectively manufacturing the designed memory circuits. The increase in density of the circuits leads manufacturers to construct memories whose elementary pitch is of the order of a micrometer. Consequently, the photolithographic masks used for manufacturing memories must be precision made: they are expensive.

Furthermore, the technical development of circuits is such that the commercial interest of these circuits is limited in time. They become rapidly obsolete. For this reason, manufacturers do not have sufficient time for improving the productivity of their machines. The yields of such manufacturing machines are always less than one. The manufacture, or rather sampling, of the memories is therefore followed by a phase for verifying the quality of the memories manufactured: the defective parts are rejected. The rejects are all the more numerous the larger the memories to be manufactured or the smaller their manufacturing pitch or else the more recent the design of the circuit. To overcome these drawbacks, manufacturers have thought of providing these memories with repair circuits. The purpose of the repair circuits is to substitute, in a memory, a circuit in good condition for a defective circuit. The aim of the present invention is to increase the operating efficiency of the repair circuits as well as simplifying the use of these repair circuits. The result is an increase of manufacturing efficiency.

In memories, the information is stored in memory cells. They are spaced apart in a matrix in lines and columns. The memories also comprise decoders: at least one line decoder for selecting a line of cells and possibly a column decoder for selecting a column of cells. In the memories, the cells of the same cell line are connected to a common connection or possibly the same two complementary connections called bit lines. These bit lines convey the electric states contained, or to be contained, in the memory cells. These bit lines are biased at each end by a supply circuit and are each connected at the other end to a bit line selection circuit. The bit line selection circuits of a cell line are themselves controlled by outputs of the line decoder which correspond to the cell line in question. The repair circuits concerned by the present invention are circuits interconnected between selection circuits and the corresponding outputs of the decoder.

The purpose of these repair circuits is to disable the selection circuits of a cell line and thus to place the bit lines of this cell line out of action. When such disabling takes place, the repair circuit establishes a connection between the decoder and a repair connection. An additional cell line is connected to this repair connection. This additional line is redundant with respect to the nominal capacity of the memory. The repair circuits must then be able to be in two distinct states. In a first state, they do not interfere with the normal operation of the decoder, of the selection circuits and of the cell lines. During repair operation, they transport the selection orders assigned to the cell line in poor condition to a redundant cell line. In order to be able to assume these two states, the repair circuits of the prior art comprise a flip flop circuit connected in cascade with a fuse. In a normal situation, the fuse is not cut, the flip flop is in a first state. When it is desired to pass to a repair situation, the fuse is decomposed. Such decomposition of the fuse is obtained by external means. The flip flop then changes state.

Means are known in the prior art for melting the fuses. These means comprise essentially means for holding the semiconductor chip opposite a laser. The laser ray is moved with respect to the chip so that this ray is directed very precisely on a fuse to be melted. A laser ray pulse is sent: the fuse melts. The repair circuit then changes state and a connection is formed between the output or outputs of the decoder which corresponds to the cell line in question and a repair connection which is connected to an additional cell line. At the same time, the information concerning the change of state of the repair circuit is used for disabling the circuits selecting the cell line thus placed out of action.

Such a construction has two drawbacks. The main drawback resides in handling of the laser. On the one hand, the acquisition of the laser is expensive which increases the price of the manufactured memories, and on the other hand handling of this laser is delicate. In fact, the laser must be positioned with respect to the chip so that it aims exactly at the position of the fuse to be melted. The time lost in learning how to handle the laser, handling relative to each type of memory manufactured, reduces the commercial lifespan of the memory in question. Furthermore, it is not always sufficient to replace a defective cell line by a redundant cell line. In fact, if the defective cell line is the location of an electric short circuit, for example between one of its bit lines and a power supply circuit, the memory, which is functionally sound since it is repaired, is even so rejected during verification tests for excess electric consumption. This excess electric consumption places the circuit outside the specification ranges guaranteed by the manufacturer. Thus, all the advantages which had been hoped for cannot be expected of the repair circuits.

SUMMARY OF THE INVENTION

The present invention overcomes the above mentioned drawbacks by providing repair circuits in which access to the fuse for decomposing it is obtained by using quite simply one of the decoders of the memory. The address of a cell line or column in question is programmed therein, which allows it to be selected, and at the same time a pulse is sent to a single additional control terminal for decomposing the fuse corresponding to the selected cell line or column. Furthermore, the change of state information concerning the information repair circuit is also used for cutting off the power supply to the cell line in question.

The invention provides then an integrated circuit memory in which memory cells are divided in a line and column matrix, the cells of the same cell line being connected to the same connections called bit lines, these bit lines being each biased on the one hand by a power supply circuit and being each in series on the other with a bit line selection circuit, in which repair circuits comprise means for disabling the selection circuits and thus placing bit lines of cell lines out of the circuit, and means for enabling circuits for selecting bit lines of additional cell lines which replace the cell lines placed out of action, further comprising means for interrupting the power supply of the cell lines placed out of action.

BRIEF DESCRIPTION OF THE DRAWINGS

The invention will be better understood from reading the following description with reference to the accompanying Figures. This description and these Figures are only given by way of indication and are in no wise limitative of the invention. In particular, it is quite possible to transpose the description of the invention relating to static memories to memories of a different type, (DRAM, EPROM ...) or whether these memories are random access memories or not. In addition, the description likening the lines to bit lines and the column to word lines does not put an obstacle in the way of an obvious transposition of the means used. They may be associated with one or other of these directions of division of the memory. These Figures show:

FIGS. 2 and 3, variants of the memory of the invention.

DESCRIPTION OF THE PREFERRED EMBODIMENTS

Figure 1A:
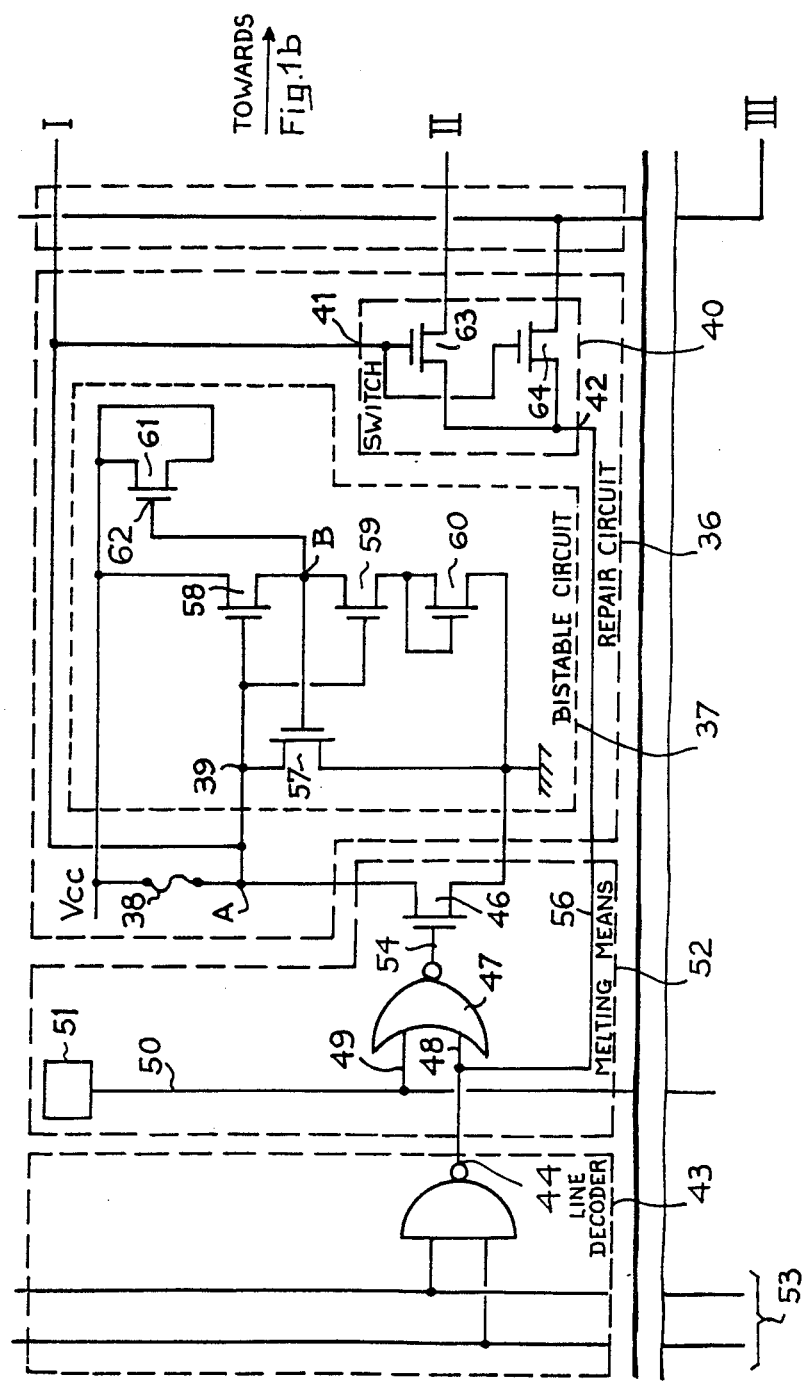
FIGS. 1a and 1b, a schematical representation of the memory comprising the features of the invention. These Figures are shown on two separate sheets which correspond exactly by the three connections I, II, III.
Figure 1B:
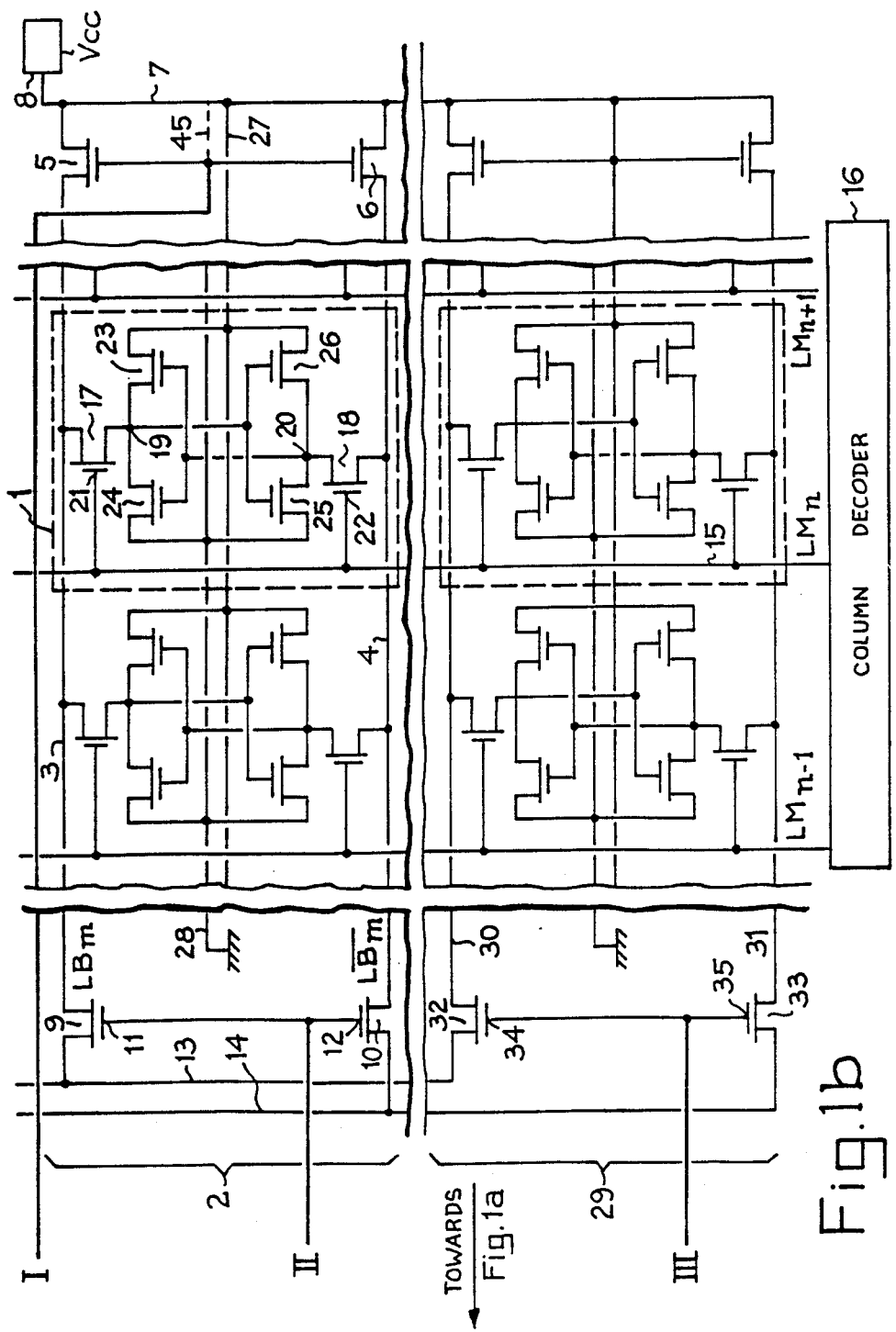

FIGS. 1a and 1b show a static random access memory incorporating the improvements of the invention. This memory is constructed as an integrated circuit. What is shown in the FIGS. 1a and 1b is a general diagram of the organization of this memory. Using conventional technology and known methods such memories can be constructed. The memory comprises (FIG. 1b) an arrangement of memory cells 1 divided into lines and columns. All the cells of a given line 2 are connected to the same two complementary connections 3 and 4 called bit lines. They are said to be complementary because when one is in a given electric state (corresponding to a given logic state), the other is in a complementary electric state (corresponding to an inverse logic state). These bit lines 3, 4 (marked as LBm and LBm) are each biased at one end by a power supply circuit respectively 5 and 6. More generally, circuits 5 and 6 each comprise a transistor connected on the one hand to a power supply connection 7 which receives a potential $V_{cc}$ through an external pin 8. The purpose of these biasing circuits is to maintain the bit lines 3 and 4 at potentials less than $V_{cc}$ so that these potentials may switch from one state to another ($V_{cc}$ or O) depending on the state of the information contained in a cell such as 1 when this cell 1 is placed in relation with these bit lines.

At another end, bit lines 3 and 4 are each in series with a selection circuit. In one example, the selection circuits each comprise a transistor 9, 10 in series with the bit line. These transistors 9, 10 receive on their control electrodes, respectively 11 and 12, an order coming from a decoder. This order is transmitted by the connection II. When the decoder selects a cell line, electrodes 11 and 12 are brought to potentials such that transistors 9 and 10 are equivalent to short circuits. The electric states conveyed by the bit lines 3 and 4 are then applied to two complementary output connections respectively 13 and 14. Connections 13 and 14 may thus be placed in relation with any of the cell lines of the memory. But at a given moment, only the cell line selected may transmit its information to these output connections.

In order to select a cell from all the other cells of the same line, this cell may further receive a communication instruction delivered by an additional lead 15 called a word line. All the word lines of the memory are in relation with a decoder called column decoder 16. The column decoder 16 further receives the column addresses of the information contained, or to be contained, in the memory and which it is desired to read out, or write in. If the address of the memory cell is known it is possible to access it, by locating the memory word to which it belongs by a word line such as line 15, and selecting by a connection such as connection II the cell line to which it also belongs. The memory cell 1 consequently comprises two selection circuits, respectively 17 and 18, connected to the two bit lines on the one hand and to two complementary information take off terminals, respectively 19 and 20, on the other hand. The control electrodes 21 and 22 of these circuits are connected to the word line 15. For stocking of the information, cell 1 comprises essentially a bistable of a known type, here with four transistors numbered 23 to 26, supplied by two connections respectively 27 and 28 between $V_{cc}$ and ground.

In the invention, the memories also comprise additional cell lines such as 29 comparable to the normal cell lines. The cells of the redundant cell lines are connected, cell by cell, to the same word lines as those of the cell lines 2. The purpose of the repair circuits (FIG. 1a) is to switch the selection applied to connection II into a selection applied to a connection III which allows the cell line 29 to be also in relation with connections 13 and 14 by means of series transistors 32 and 33 whose control electrode, 34 and 35, is connected to the connection III. In other words, at all times, the orders given over the connection II of a cell line and over connection III of the memory are complementary: either a cell line is in good condition and the redundant cell line 29 is not used or else it is the contrary. In normal operation, a repair circuit is assigned to a cell line 2. If, in the memory there is only one redundant line 29, the memories can only be repaired if they contain only a single defective cell line.

The repair circuit 36 for a cell line shown in FIG. 1a comprises three parts. A first part 37 comprises a bistable circuit. A second part 38 is formed essentially by a fuse which connects a terminal 39 of bistable circuit 37 to an imposed potential (here the supply potential $V_{cc}$). In a third part, the repair circuit 36 comprises a switch 40 receiving on a control input 41 a voltage corresponding to the electric state of the bistable circuit 37 and receiving on a switching input 42 a signal coming from decoder 43. This order, which is the selection order, is transmitted depending on the state of bistable circuit 37 over connection II to the cell line 2 which corresponds to the concerned output 44 of decoder 43, or over a repair connection III. The connection II is proper to each cell line. The connection III provides conveyance parallel to the memory plane and to the output connections 13 and 14 (or, which amounts to the same thing, parallel to the word lines 15). The connection III therefore connects together all the repair circuits of a group of cell lines to which the same redundant cell line 29 has been attributed. For the repair to be feasible, only a single one of the cell lines of this group must be defective.

An important feature of the invention is that the electric state of bistable circuit 37, which is used for switching the selection, in switch 40, of the cell lines 2 or 29 is also used, through a connection I for controlling the power supply circuits 5 and 6. These latter provide biasing of the bit lines 3 and 4 of the cell line 2 which it is desired to decouple from the memory. The cell line 2 is therefore decoupled functionally from the memory by application, of the order, coming from switch 40, to the selection circuits 9 and 10 over connection II. It will also be decoupled electrically from the memory by application of an adequate signal to circuits 5 and 6. What is therefore new in the invention is that circuits 5 and 6 are on off controlled instead of leaving them permanently connected as was the case up to now by a connection 45 shown here with a broken line.

Having bistable circuit 37 available, it is quite judicious to use the information which it represents and which in itself gives information about the state of the bit line, for driving the circuits 5 and 6. That is not an obligation. However, for space saving reasons during implantation of the circuits in the general array of the memory, this arrangement is quite interesting: there is only the connection I to be formed. It will be noted from examining FIG. 1b that the provision of connection I may offer a certain difficulty since it passes through a good part of the memory. In fact, since it is parallel to a bit line (for example the bit line 3) it may be formed, for the major part thereof, at the same time as this line. For the remainder, it is sufficient to adapt the times during which different connections are formed in the memory for forming at the same time the complementary parts of this connection I.

The memory further comprises intrinsic means 52 for melting the fuses. These means are not means provided externally such as a laser. They are means contained in the logic circuits of the memory. The means for melting the fuses corresponding to each cell line comprise essentially a switch 46, connected in series with the fuse 38, controlled by a logic gate 47. This logic gate 47 has two inputs. A first input 48 is connected to an output 44 of the decoder which designates the cell line which it is desired to select. A second input 49 is connected to a connection 50 common to all the logic gates of the repair circuits of the memory. It is further connected to a single external access terminal 51.

The means 52 for melting fuse 38 operate as follows. Over a bus 55 there is sent to the decoder 43 the line address of a cell line which it is desired to neutralize becuase it has been ascertained that this line was defective. The defect may be functional and/or electric. The decoder 43 delivers at its output 44 relative to this line an electric state, in one example a zero state, corresponding to the selection of this line. The terminal 51 which in normal operation is brought to an electric state 1, for example $V_{cc}$, is brought by external means to a zero state. These external means may be any electric contact means. The logic 47, which in the example is a NOR gate, delivers at its output 54 a state 1 since it receives two zero states as input. Switch 46 which essentially comprises a large transistor receives this state 1 on its base and short circuits itself. The fuse is then connected in parallel between the power supply $V_{cc}$ and ground. A heavy current may then flow through this fuse. This current magnitude is proportional to the size of the transistor 46. This current causes the fuse to melt and this latter is decomposed.

Consequently, the point A, the middle point between fuse 38 and switch 46 which was beforehand forced to a potential $V_{cc}$, is now open circuited. Therefore, circuit 37 is capable of changing state. The electric state at point A, available at the terminal 39 of circuit 37, changes and allows switch 40 to switch.

The operation of switch 40 is explained as follows. Switch 40 comprises two transistors respectively 63 and 64 in accordance with complementary technology: in one example, transistor 63 is of P type and transistor 64 is of N type. They receive the same potential of point A on their control electrode. They are further connected by one of their main electrodes to a connection 56. This connection 56 leads to the output 44 of decoder 43 which governs the cell line in question. Depending on the electric state of point A and when connection 56 receives an electric state corresponding to the selection of the cell line, a single one of these two transistors 63 and 64 is enabled for allowing this information to be conveyed to the connections II or III, respectively. This alternative reflects the condition in which the fuse is to be found: in good condition or decomposed.

The order for selecting the cell line available at the output 44 of decoder 43 transits to switch 40. In one example, this order is orientated by this switch to the connection III corresponding to the redundant cell line, whereas connection II passes to a disabled state for decoupling line 2. Once the defects are thus compensated for, the memory, may be used as any memory. The address of the redundant cell line which has taken the place of the defective cell line is thus ficticiously assigned to the address of the cell line which it replaces. Thus it can be seen that use of the laser is no longer necessary. In fact, the destruction of the fuses is caused by using the possibilities of decoder 43 to which is applied the address of the defective cell line. It will be seen further on that it is possible to repair several defective cell lines by dividing the memory.

Then, once all the repairs have been undertaken, terminal 51 is again biased to an electric state one: selection of the cell lines is provided on request during use by the connections 56 which connect the concerned outputs of the decoder to the concerned inputs of switches 40. There is no inconvenience at all in having a single connection 50 for effecting all the desired cell line repairs. In fact, only one logic gate 47, the one which receives the selection order from the decoder 43 and the order for decomposing the fuse, lets the useful order through to its output 54. The other logic gates of the other repair circuits of the other cell lines remain inactive.

The invention comprises a further feature with respect to the state of the art. This feature belongs to the bistable 37. In fact, when fuse 38 is destroyed by a laser ray, it is possible to design a simple circuit so that point A changes electric state. This simplicity is unfortunately not possible in the invention in which the presence of switch 46 can be seen. Once fuse 38 has been destroyed, point A must not remain open circuited but must reliably change electric state. This is the role of circuit 37 of the invention. Any other circuit may of course be used but the one which is described here has further other advantages.

This circuit 37 comprises essentially five transistors: transistors 57 to 61. In one example in which the memory is formed from complementary MOS technology (CMOS), only transistor 58 is of type P the others are of type N as well as the switching transistor 46. Transistors 58 to 60 are connected in cascade between the power supply $V_{cc}$ and ground. Transistor 57 is connected in parallel between point A and ground. Point A is connected to the control electrode of transistors 58 and 59. The middle point of these two transistors is connected on the one hand to the control electrode of transistor 57 and on the other to the control electrode of transistor 61. The control electrode of transistor 60 is brought to the same potential as its drain. The drain and source of transistor 61 are brought to the potential $V_{cc}$.

When the fuse is not destroyed, point A is brought to potential $V_{cc}$. Transistor 58 which is of type P is therefore disabled. Consequently, point B, which is the middle point between transistor 58 and transistor 59 is at zero. Therefore transistor 57 is disabled since it is of type N and since it receives a zero state on its control gate. The disabled transistor 57 keeps point A at $V_{cc}$. Consequently, circuit 37 is stable in the state where point A is brought to potential $V_{cc}$.

On the other hand, when the fuse is destroyed a zero state appears at point A in the following way. At the time when voltage is applied to the memory (the day when it is decided to use it), transistor 61 which behaves with respect to voltage application like a capacity transmits a state 1 to its gate 62. Point B at state 1 short circuits the transistor 57. Consequently, point A drops to the zero state. Point A at zero state enables the transistor 58. Point B is now achieved at 1 because it is effectively brought to the potential $V_{cc}$. Thus, circuit 37 is confirmed in another stable state the reverse of the preceding one.

The presence of the transistor 60 is useful for shifting the triggering threshold of the bistable in the right direction. This shift, which has no influence when fuse 37 is in good condition, is on the other hand oriented in the right direction, the one which tends to bring B to $V_{cc}$, when the fuse is decomposed. Similarly, transistor 46 which played the role of switch and which is a large transistor behaves, in the disabled state, as a large capacity at the moment when voltage is applied to the memory. Consequently, point A, at the time of application of voltage, rather tends to be brought to ground potential than to remain open circuited. This evolution is also favorable to the appearance of a potential A at zero when the fuse is decomposed.

FIG. 2 shows a preferred architecture for construction of the memories. In this, the cell lines such as 2 are grouped together in groups such as 65 comprising a given number of cell lines: for example 16. To each group of cell lines is assigned a redundant cell line 29. This line 29 may replace that of lines 2 which proves defective. In this embodiment will be noted the line decoder 43 which provides accessing to all the cell lines of the memory. Downstream of decoder 43 is situated the assemblies 72 of circuits 52 for melting the fuses relative to the cell lines: the same connection 50, connected to the external terminal 51, serves all the circuits 52. On the other hand, the assembly of repair circuits 36 is divided into groups 73 corresponding to the cell line groups 65. For each group 73 there is only a single connection such as III which provides access to the redundant cell line 29. On the other hand, there are as many connections II and I as there are cell lines in the group. Finally, under the stack of groups may be distinguished the decoder 16 which provides access to the columns of the memory. Decoder 43 and decoder 16 are connected to address buses respectively 53 and 66 for selecting the information contained in a single cell of the memory. In the description made up to now, the memory cells are cells representative of an information bit. The invention is quite transposable to memories in which the memory cells comprise several information bits.

FIG. 3 shows another embodiment of the invention. In this variant, the provision of bistable 37 and switch 46 proved too space consuming to be readily integrated opposite a cell line 2. The space they require is such that they necessarily encroach on the space reserved for two cell lines. Since the organization presented up to now is made cell line by cell line, this consequence may be a inhibitory loss of space. To overcome this drawback, it may be decided to connect two adjacent cell lines, lines 2 and 67, to the same repair assembly. The result is immediately that the redundant line 29 must also be expanded by the connection of another redundant line 68. In this variant, there is only a single fuse for the repair circuit, but this latter is used as soon as any one of the two cell lines concerned proves defective.

The outputs of the decoder, respectively 44 and 69, relative to these lines are then introduced into a logic gate 70 whose output is connected to the control electrode of means 36, 52 for melting the fuses. The information available at point A of the repair circuit is then transmitted to two parallel switches: switches 40 and 71. These switches switch the accesses to lines 2 and 67 into accesses respectively III and IV to the redundant cell lines 29 and 68. These latter two cell lines as well as all the cell lines, either of a group of cell lines or of the memory itself, are also connected to the output connections 13 and 14. Switch 71 is quite comparable to switch 40. In the example shown, gate 70 is an AND gate since the selection of the cell lines concerned is made by a zero logic state for the outputs respectively 44 and 69 of the decoder 43.

What is claimed is:
1. An integrated circuit memory, comprising:
  memory cells divided into lines and columns in a matrix, the cells of the same cell line being connected to the same connections called bit lines, said bit lines being each, on the one hand, biased by a power supply circuit and, on the other, each in series with a respective bit line selection circuit,
  repair circuits comprising means for disabling the selection circuit and thus placing bit lines of cell lines out of action and means for enabling circuits for selecting bit lines of additional cell lines which replace the cell lines placed out of action, and means for interrupting the power supply to the cell lines placed out of action wherein said power supply circuits each comprise a transistor connected to a supply terminal of a corresponding bit line of the memory, to a power supply terminal, and, by its control electrode, to said interrupting means.

2. The memory as claimed in claim 1, wherein the interrupting means are controlled by the disabling and enabling means contained in the repair circuits.

3. The memory as claimed in any one of claim 1 or claim 2, wherein said selection circuits each comprise a transistor controlled by its control electrode at which it receives a selection order delivered by a decoder.

4. The memory as claimed in claim 1, wherein said interrupting means comprise a bistable circuit whose electric state is imposed by the condition, decomposed or not, of a fuse and a connection connecting the output of this bistable circuit to the control electrodes of the transistors of the power supply circuits.

5. The memory as claimed in claim 4, further comprising, for each cell line of the bit line selection circuits, one of said repair circuits, and a part of a decoder which concerns this cell line, the whole of these circuits being integrated in the memory, and the connection connecting the output of the repair circuit to the transistors of the biasing circuit extends in the memory parallel to the bit lines of the cell line.

* * * * *